United States Patent
Varanasi et al.

(10) Patent No.: US 7,687,436 B2
(45) Date of Patent: Mar. 30, 2010

(54) FLUX PINNING ENHANCEMENTS IN SUPERCONDUCTIVE $REBA_2CU_3O_{7-x}$ (REBCO) FILMS AND METHOD OF FORMING THEREOF

(75) Inventors: Chakrapani Varanasi, Dayton, OH (US); Paul N. Barnes, West Milton, OH (US)

(73) Assignee: University of Dayton, Dayton, OH (US)

( * ) Notice: Subject to any disclaimer, the term of this patent is extended or adjusted under 35 U.S.C. 154(b) by 518 days.

(21) Appl. No.: 11/565,888

(22) Filed: Dec. 1, 2006

(65) Prior Publication Data

US 2007/0129255 A1 Jun. 7, 2007

Related U.S. Application Data

(60) Provisional application No. 60/741,577, filed on Dec. 2, 2005.

(51) Int. Cl.
*B05D 5/12* (2006.01)
(52) U.S. Cl. ............... 505/325; 505/480; 427/62
(58) Field of Classification Search ........... 505/325, 505/480; 427/62; 204/157.41, 192.24
See application file for complete search history.

(56) References Cited

U.S. PATENT DOCUMENTS

| | | | |
|---|---|---|---|
| 5,124,310 A | 6/1992 | Ovshinsky et al. | |
| 5,432,151 A | 7/1995 | Russo et al. | |
| 6,602,588 B1 | 8/2003 | Kwon et al. | |
| 6,676,811 B1 | 1/2004 | Barnes | |
| 6,690,957 B2 | 2/2004 | Akasegawa et al. | |
| 6,830,776 B1 * | 12/2004 | Barnes et al. | 427/63 |
| 6,994,775 B2 * | 2/2006 | Holesinger et al. | 204/192.11 |

OTHER PUBLICATIONS

Jongprateep et al "Effect of BaCeO3 and BaSnO3 Additives on Microstructural Developmemnt and Critical Current Density of Melt Textured YBa2Cu3O7-y", IEEE Trans on Applied Supercon, vol. 15, No. 3, Sep. 2005 (pp. 3864-3867).*
Kechik et al "Artificial pinning centers in YBaCuO Thinf Films of Gd2Ba4CuWOy nanophase inclusions", Superconductor Sci Technol. 22 (2009) 034020 (5pp).*
Lepropre et al "Critical currents up to 71 000 A-cm-2 at 77K in melt textured YBCO doped with BaSnO3", Cryogenics, vol. 34, Issue 1, Jan. 1994 pp. 63-67 (Abstract Only).*
Varanasi et al "Flux Pinning Enhancement in YBa2Cu3O7-y films with BaSnO3 nanoparticles", Supercon Sci Technol 19, No. 10 (Oct. 2006), L37-41.*

* cited by examiner

*Primary Examiner*—Mark Kopec
(74) *Attorney, Agent, or Firm*—Dinsmore & Shohl

(57) ABSTRACT

Nanometer-sized non-superconducting particulates in superconductive REBCO films, where RE is a rare earth metal, for flux pinning enhancement and a method of forming are disclosed. A target with a second phase material sector portion and a superconductive material portion is used in a pulse laser deposition process to form films on substrates according to the present invention. The films consist of 10-20 nm-sized precipitates. In a 0.5 µm thick film, a transport critical current density $(J_c)>3$ MA/cm$^2$ at 77K in self-field was measured. In one embodiment, magnetization $J_c$ at 77 K and 65K showed significant improvements in a composite YBCO films with fine precipitates produced according to the present invention as compared to non-doped (standard) YBCO films (>10 times increase at 9 T, 65 K).

6 Claims, 13 Drawing Sheets

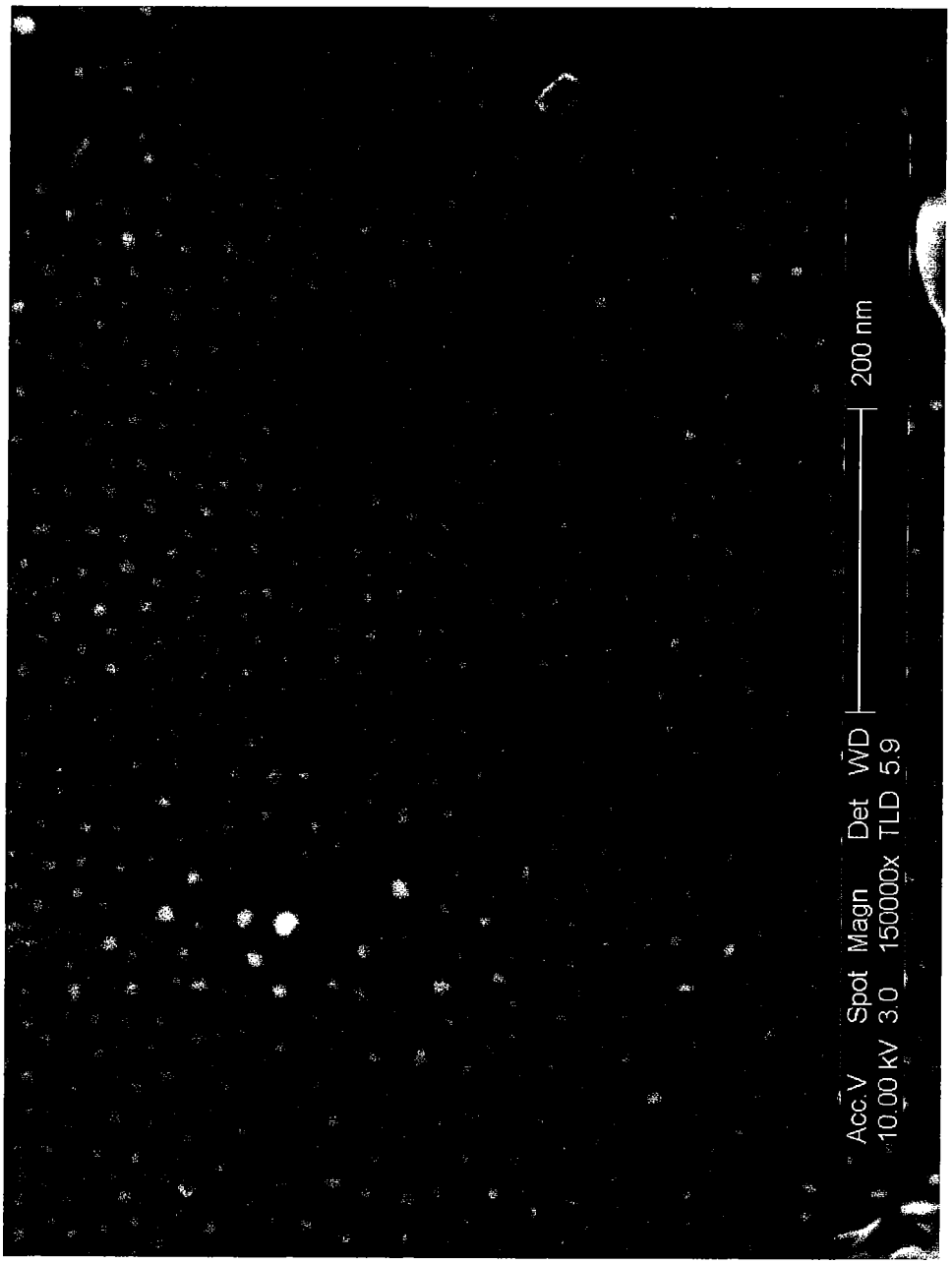

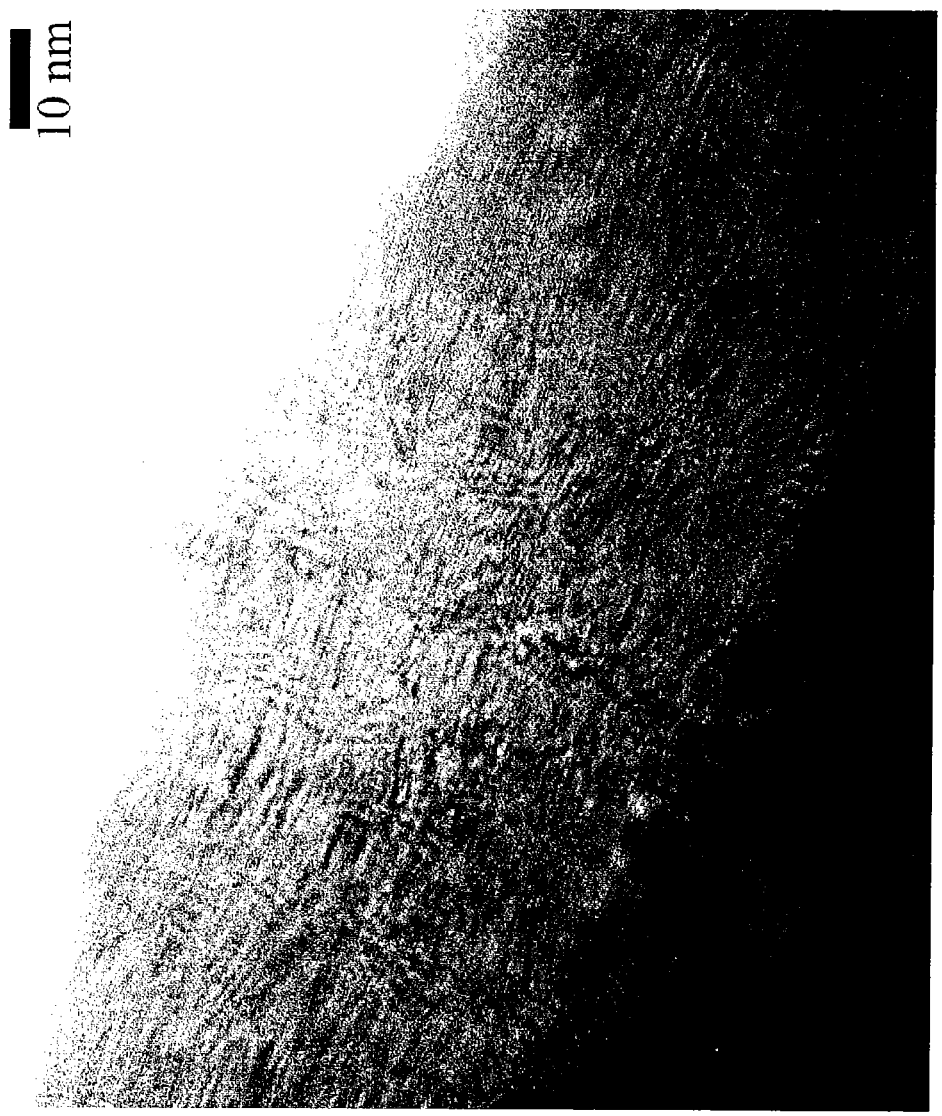

FLUX PINNING ENHANCEMENTS IN SUPERCONDUCTIVE REBA$_2$CU$_3$O$_{7-x}$ (REBCO) FILMS AND METHOD OF FORMING THEREOF

CROSS-REFERENCE TO RELATED APPLICATIONS

This application claims the benefit of U.S. Provisional Application Ser. No. 60/741,577, filed Dec. 2, 2005.

FIELD OF THE INVENTION

The present invention is related generally to superconductive films, and in particular to introducing a controlled random inclusion of nanometer-sized non-superconducting particulates in superconductive REBa$_2$Cu$_3$O$_{7-x}$ films for flux pinning enhancement.

BACKGROUND OF THE INVENTION

Introduction of flux pinning centers in melt textured REBa$_2$Cu$_3$O$_{7-x}$ (REBCO where RE is a Rare Earth metals such as, for example, Y, Sm, Nd, etc.) is known to improve the critical current density ($J_c$) of such superconductive materials significantly. Approaches to obtain significant enhancements by incorporating nanometer sized particulates that act as flux pinning centers in REBCO thin films has also been recently demonstrated. For example, significant improvements in $J_c$ have been demonstrated in the prior art in pulsed laser deposited (PLD) YBCO films with Y$_2$BaCuO$_5$ (Y211), Y$_2$O$_3$, Nd$_2$O$_3$, and BaZrO$_3$ particulates.

In such PLD films, particulates are generally introduced by two prior art methods as explained hereafter. The first approach uses a single YBa$_2$Cu$_3$O$_7$ (Y123) target which includes finite amounts of a second phase material. The target is prepared by blending YBCO powder with a desired amount of second phase materials and sintered them together to form a composite target of the superconductor and pinning materials. However, reactions with the pinning material and YBCO during the target preparation are possible in this approach if the pinning material is not chemically compatible with the YBCO. In addition, targets with dissimilar melting point compositions (e.g. low melting point metal+YBCO) are hard to make. Furthermore, the single composite target offers little control on the content, size, and distribution of the pinning centers through the thickness of the films formed during the pulsed laser deposition process.

The other approach uses two different targets of YBCO and the second phase material. During deposition each target is alternatively switched in a periodic fashion resulting in the introduction of island growth pining centers in a layered fashion. One disadvantage of this approach is that the second phase material particles may have to stay at high growth temperature (750-780° C.) for long time on a YBCO film during the period that the targets are switched causing opportunity for particle growth and increased extent of any reactions. Another particular disadvantage, other than the necessity of alternating between targets, is that the pinning centers generally are arranged in a lamellar fashion. This laying of the second phase particles throughout the superconductive film causes pinning centers with a more directional dependence of the critical current density ($J_c$). The formation of a directionally dependent critical current density ($J_c$) is undesirable as a random distribution of the pinning centers in the films without the layered structure is desired to avoid any preference for a given magnetic field orientation. A non-directional critical current density ($J_c$) is especially useful in superconducting coil applications, where the magnetic field is present at a variety of angles to the coils.

SUMMARY OF THE INVENTION

It is against the above background that the present invention discloses herein a multiple phase target useful in pulsed laser deposition that contains distinct phases, and methods of making the same and using the target to make composite superconductive coatings having a controlled random inclusion of nanometer-sized non-superconducting particulates for flux pinning enhancement.

In one embodiment, a method of forming a superconductive film is disclosed. The method comprises providing a target having a first portion of a superconductive material and a second portion of a non-superconductive material, and providing a substrate a distance from the target. The method further comprises rotating the target at a desired speed to obtain a predetermined pulse ratio of the superconductive material to the non-superconductive material, and striking the rotating target with a laser to provide the substrate with a film of the superconductive material. The film has a random inclusion of nanometer-sized particulates of the non-superconducting material for flux pinning enhancement.

Some of the noted advantages of the present invention are, not limited too, it can be used: to make composites with nanometer inclusions in a continuous fashion; to grow multilayer coatings; and to form alloy coatings that are difficult to form. In addition, metal/ceramic nano-composites can be made easily, separation of constituent materials is provided avoiding undesired reactions during target preparation, and single target use for continuous fabrication.

These and other features and advantages of the invention will be more fully understood from the following description of various embodiments of the invention taken together with the accompanying drawings.

BRIEF DESCRIPTION OF THE DRAWINGS

FIGS. 8a, 8b, and 8c show various views of a YBCO+BaSnO$_3$ film sample according to the present invention, where FIG. 8a is a plan view a transmission electron microscope (TEM) micrograph of the YBCO+BaSnO$_3$ film sample showing the presence of 10 nm particles (e.g., the circled particle), FIG. 8b is a plan view of a scanning electron micrograph (SEM) of the YBCO+BaSnO$_3$ film sample showing the high density of nanoparticles, and FIG. 8c is a cross-sectional view of a transmission electron micrograph (TEM) showing the particles present in the entire thickness of the YBCO+BaSnO$_3$ film sample and that the Moiré fringes extend throughout the thickness of the film indicating the presence of the particles.

DETAILED DESCRIPTION

Figure 1:
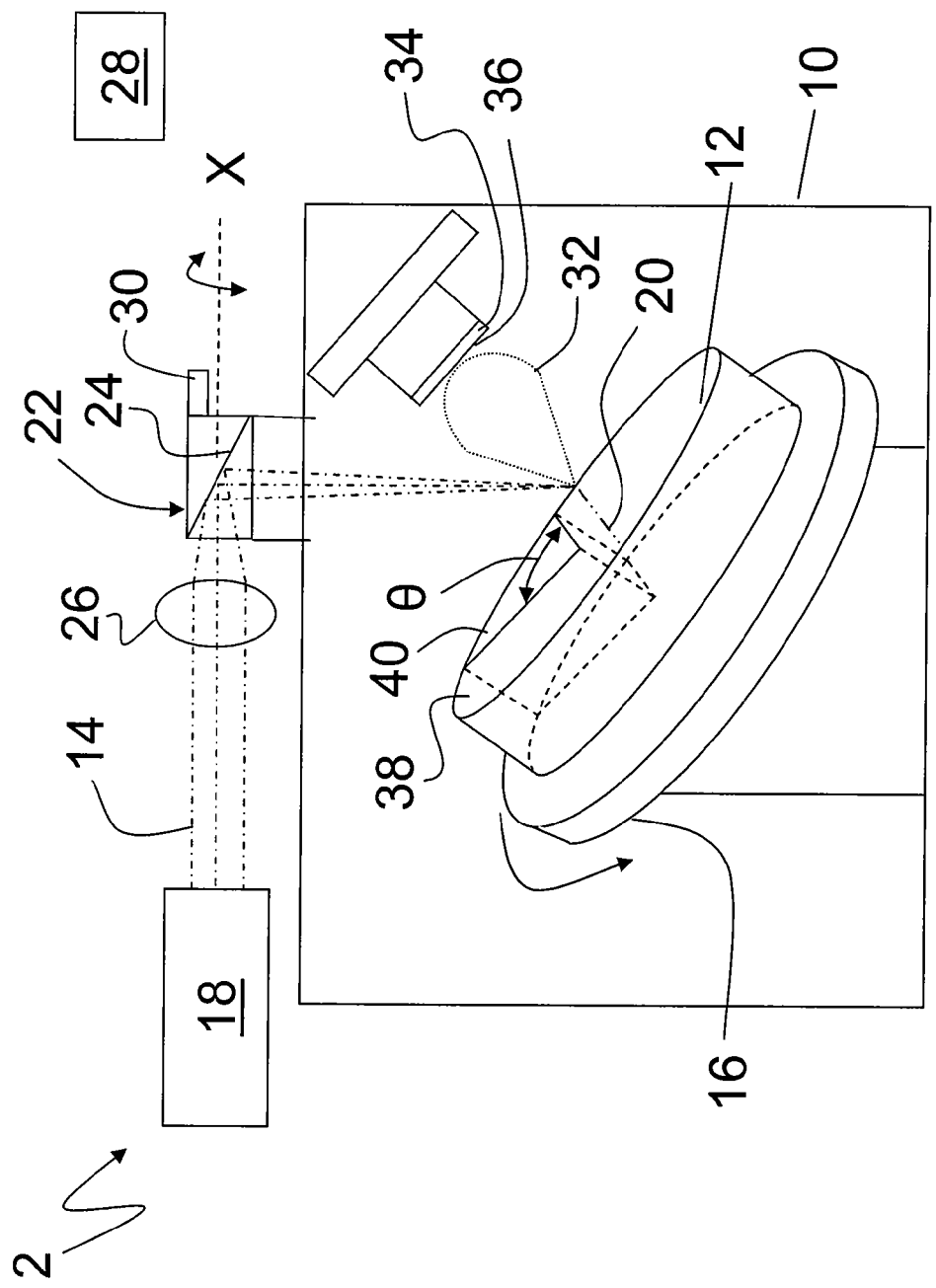
FIG. 1 is a schematic diagram of a PLD target according one embodiment of the present invention.

With reference to FIG. 1, an pulse laser ablation deposition (PLAD) system 2 is disclosed. The system 2 includes a chamber 10 that uses a target 12 according to the present invention is shown. It is to be appreciated that as PLAD is a thin film deposition technique where a high power pulsed laser beam 14 is focused inside the chamber 10 to strike the target 12, there are many different deposition chamber arrangements for PLAD.

In the illustrated embodiment, the target 12 is a disc supported in the chamber 10 on a rotating platform 16. In other embodiments the target 12 may be provided as a cylindrical rod wherein a support device within the chamber 10 provides rotational and translational movement of the rod along a support axis, and in still other embodiment may be provided in any geometric shape suitable for use in an ablation deposition chamber. The beam 14 is provided from a pulsed excimer laser 18 and may be translated about the surface of the target 12, which is illustrated by dashed line 20, by a rastering device 22. In the illustrated embodiment, the rastering device 22 has a reflective surface 24 provided after a beam focusing lens 26, whereby the reflective surface 24 is computer controlled by computer 28 and driven by an attached motor 30 to pivot about an axis X. It is to be appreciated that the entire PLAD process is controlled via computer 28, such as for example controlling a pulse rate and frequency (i.e., laser power density) of the laser 18, controlling speed of the rotating platform 16, controlling chamber environmental conditions (e.g., temperature, pressure, content, etc.), substrate temperature, and the like.

In using the system 2, when the laser beam 14 is absorbed by the target 12, energy is first converted to electronic excitation and then into thermal, chemical and mechanical energy resulting in evaporation, ablation, plasma formation and even exfoliation. The ejected species of the target 12 expand into the surrounding chamber in the form of a plume 32. The plume 32 contains many energetic species including atoms, molecules, electrons, ions, clusters, particulates and molten globules, and typically expands in a plasma parallel to the normal vector of the surface of the target 12 towards a substrate 34 provided in the chamber 10 due to Coulomb repulsion and recoil from the target surface. The substrate 34 may be any material suitable to receive a superconductive film by the method of the present invention including, for example, single-crystal substrates, tape conductors, and materials such as LaAlO$_3$, SrTiO$_3$, MgO, YSZ, Al$_2$O$_3$, ZrO$_2$ and the like. The vaporized material from the target 12 is then deposited as a thin film 36 on the substrate 34. The PLAD process can occur in ultra high vacuum or under pressure in the presence of a background gas, such as oxygen which is commonly used when depositing oxides to fully oxygenate the deposited films.

According to the present invention, the target 12 has a first portion 38 of a superconductive material and a second portion 40 of a non-superconducting second phase material. The target 12 is rotated at a selected speed within the chamber 10 during the laser ablation deposition process such that a predetermined pulse ratio of the superconductive material to the non-superconductive material is provided in the plume 32. This predetermined pulse ratio results in a composite superconductive film 36 being formed by depositing the superconductive material 42 along with a controlled random inclusion of nanometer-sized particulates of the non-superconducting second phase material 44 on the substrate 34 for flux pinning enhancement. By this method, control via computer 28 of the rotational speed, which may also be combined with a predetermined laser rastering speed, for a given sector angle θ defines the relative ablated surfaces of the portions 38 and 40, and hence the predetermined pulse ratio of materials provided by target 12 onto the substrate 34.

It is to be appreciated that the PLAD process according to the present invention offers a greater flexibility to process superconductive films with second phase particulates, which by this method can be varied in terms of the content and distribution along the thickness of the films. Additionally, size of the second phase particulates can be varied by temperature of the substrate 34, pressure of the chamber 10, power density of the laser 18, etc., as well as by the spatial distribution of the plume 32 which is dependent on the background pressure inside the PLAD chamber 10. Additional control can be obtained by selecting a different sector angle θ for the second portion 40. Varying the selected sector angle θ allows separation of the respective constituents for a more controlled introduction of random non-layered particulates. Also, since the method of the present invention uses a single target 12, as opposed to two different targets, it allows continuous fabrication on substrate 34, such as to make long length coated conductor tapes.

Figure 12:
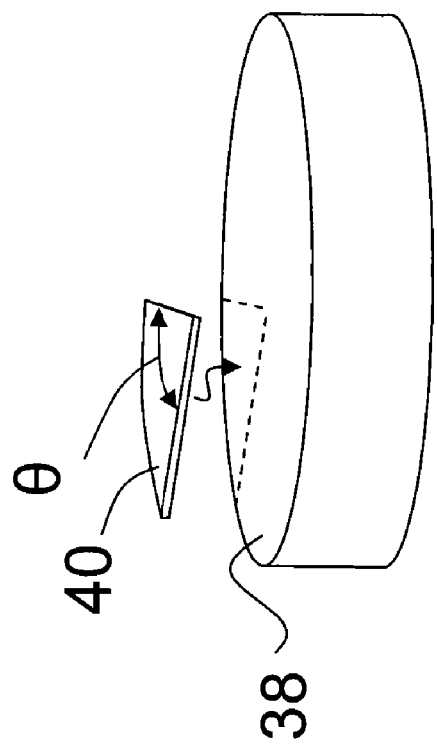
FIG. 12 is a schematic diagram of a PLD target according still another embodiment of the present invention.
Figure 11:
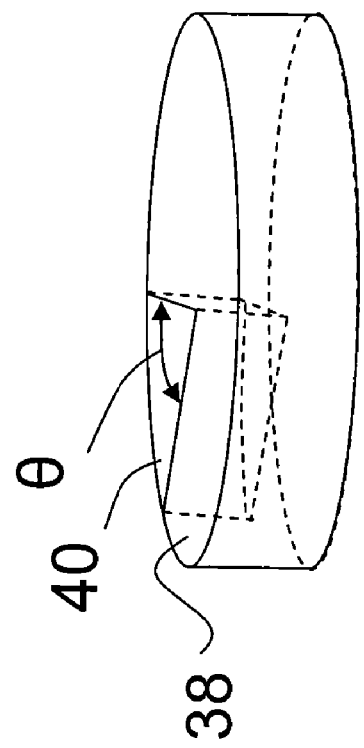
FIG. 11 is a schematic diagram of a PLD target according another embodiment of the present invention.

In the illustrated embodiment, the PLAD target 12 was made by inserting and bonding a complementary piece of a second phase material into a cutout section of a superconductive first material to provide the second portion 40 of the target with a desired sector angle θ. In one embodiment, the cutout section may slice through the entire thickness of the first material, such as shown by FIG. 1, and in another embodiment may only remove a portion of the thickness of the first material, such as shown by FIG. 11. In still another embodiment, such as shown by FIG. 12, the target 12 may be formed by providing the second phase material in a pie-shaped piece of a desired sector angle θ, and bonding the piece on top of a disc of the first material to define the first and second portions 38 and 40.

In one embodiment, film 36 was made using a target 12 having a first portion 38 of YBa$_2$Cu$_3$O$_{7-x}$ (YBCO), and a second portion 40 of $Y_2BaCuO_5$ (Y211). In one specific YBCO/Y211 target embodiment, the Y211 second portion 40 had a sector angle θ of about 30 degree. In other embodiments, the sector angle θ may range from 5 to 30 degrees or more depending upon the compositional requirements. For this illustrative embodiment, the laser 18 (e.g., a KrF excimer laser, such as for example, Lambda Physik, Model No. LPX 300) operating at an exposing wavelength of λ=248 nm, was used to deposit films at 780° C. using a 4 HZ repetition rate.

In the above embodiment, the target 12 was rotated at a speed of 15-20 rpm to obtain an approximate ratio of 11 pulses of the first material (e.g., YBCO) to one pulse of second phase material (e.g., Y211) during growth of the composite (e.g., Y211/YBCO) nanoparticle film 36. The resulting film microstructure produced by using the above mentioned YBCO/Y211 target (θ=30°), was studied using an ultra high resolution field emission scanning electron microscope (FE-SEM)(e.g., FEI Company, SIRION model). The critical transition temperature ($T_c$) was measured by AC susceptibility and a vibrating sample magnetometer (VSM) (e.g., Quantum Design PPMS system), was used to obtain magnetization $J_c$ data at 77K and 65K. Transport current measurements were taken on a 0.5 μm thick, 4-mm long, 0.5 mm wide bridge sample. The thickness of the films was measured by using a profilometer and verified with cross-sectional SEM.

Figure 2:
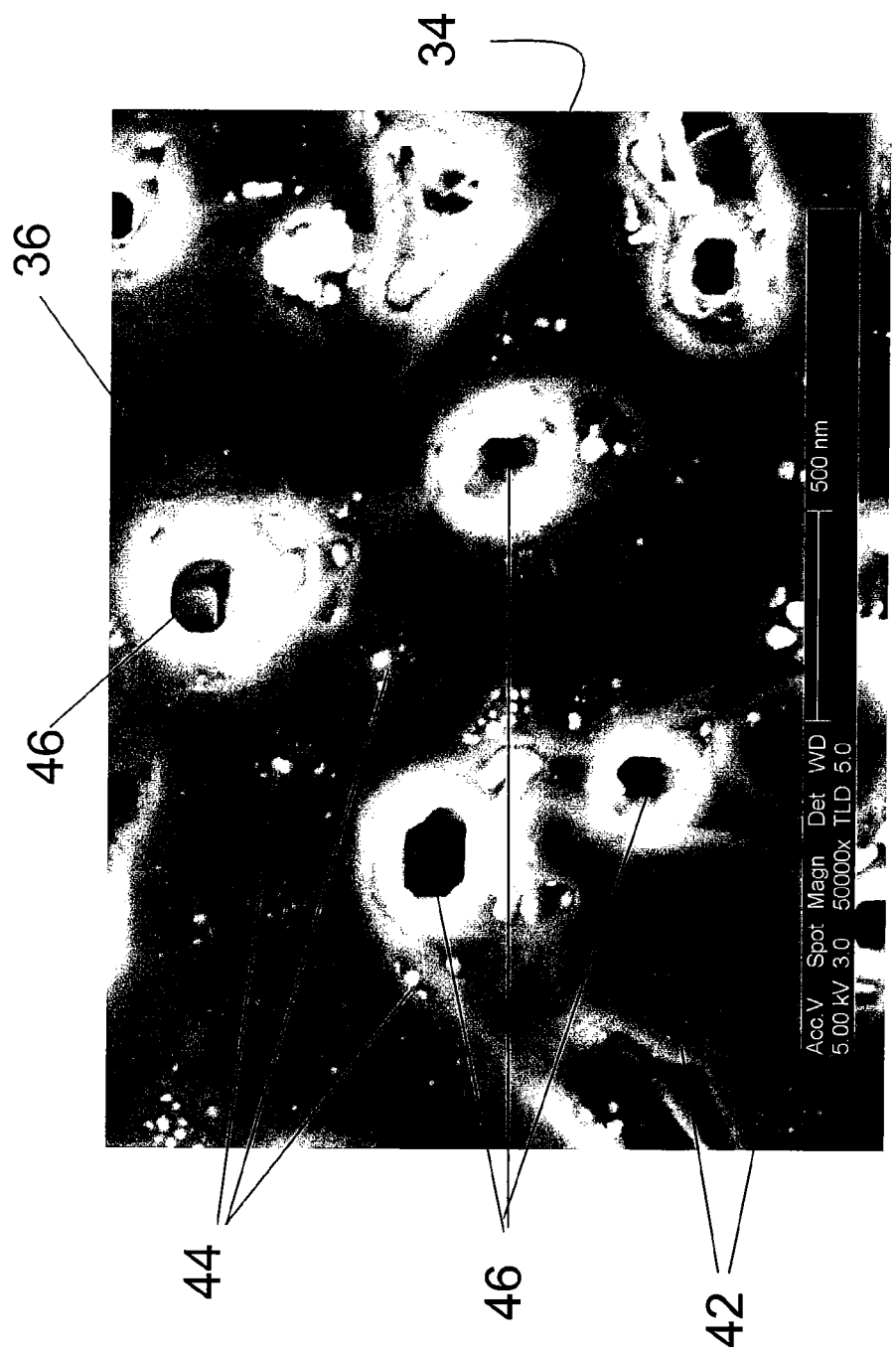
FIG. 2 is a plan view of a scanning electron microscope (SEM) micrograph of a Y211/YBCO film sample made according to the present invention and showing the presence of nanometer sized precipitates (i.e., the bright white precipitates).
Figure 3B:
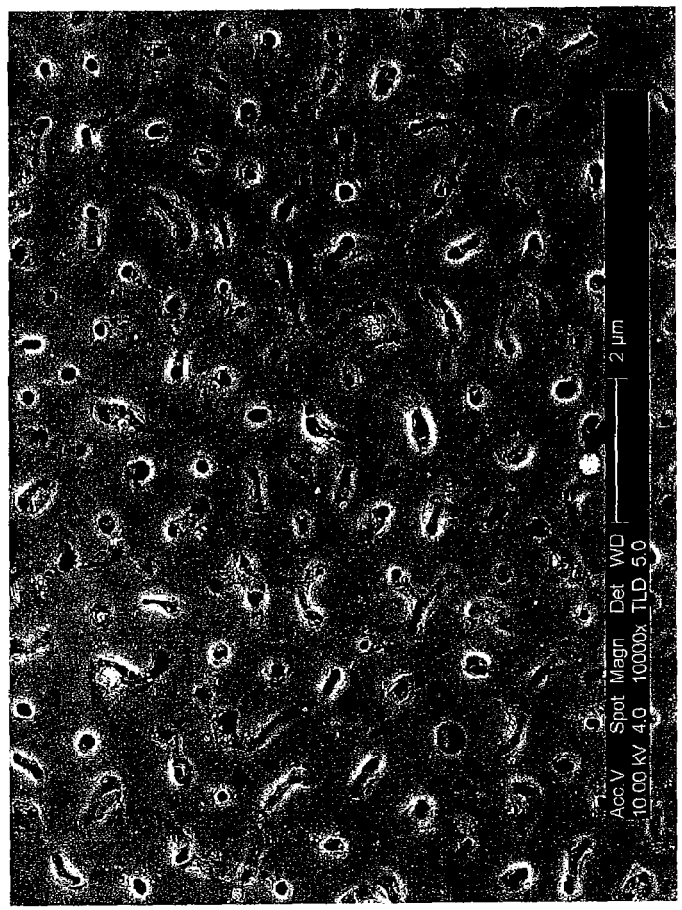
FIGS. 3a and 3b are plan views of SEM micrographs comparing the microstructures of a conventional YBCO film (FIG. 3a) and a Y211/YBCO film (FIG. 3b) produced according to the present invention in similar conditions on LaAlO$_3$ substrates, respectively.
Figure 3A:
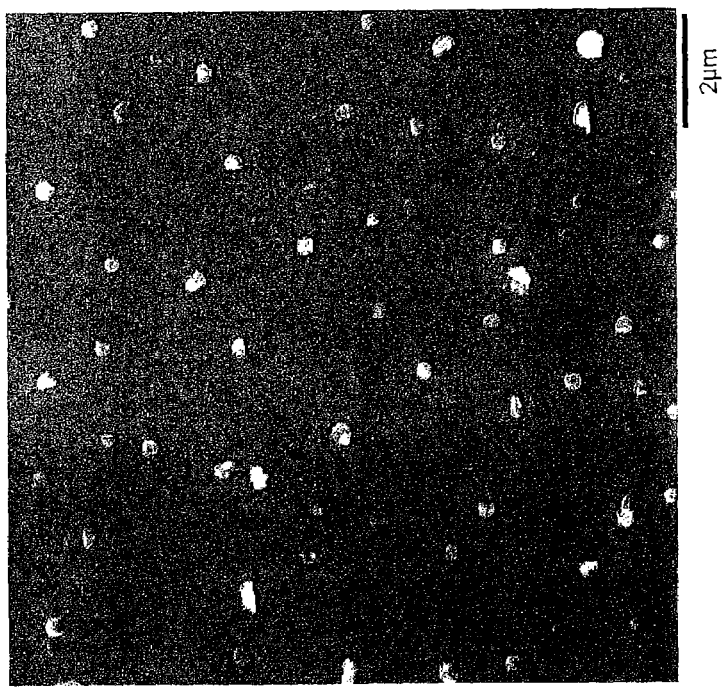

AC susceptibility measurements showed that the films processed using the Y211/YBCO target mentioned above have a 90.5 K $T_c$ onset with a sharp transition. The sharp transition indicates that the incorporation of the second phase particles (i.e., Y211) did not deteriorate the structure of YBCO films and that the films are of good quality. For example, FIG. 2 shows a high resolution SEM photomicrograph of a film 36, which shows the presence of 10-20 nm sized spherical particles of the second phase material (Y211) 44 in the film 36. The spiral growth of the grains of the superconductive first material (YBCO) 42 can also be clearly seen; and evidently, the areas where the spirals fail to coalesce appear to form pores 46 visible in the micrograph. The presence of 100-200 nm size pores 46 were observed throughout the microstructure of the film 36. The presence of the pores 46 is likely due to the particular growth parameters of Y211/YBCO films as pure YBCO films processed under similar growth conditions do not show this kind of porosity. For example, compare FIG. 3a which shows lower magnification scanning electron microstructures of a pure YBCO film with FIG. 3b which shows a Y211/YBCO film made according to the present invention taken at the same magnification. It can be seen that the porosity is much higher in the Y211/YBCO film of the present invention as compared to a pure YBCO films.

Figure 4:
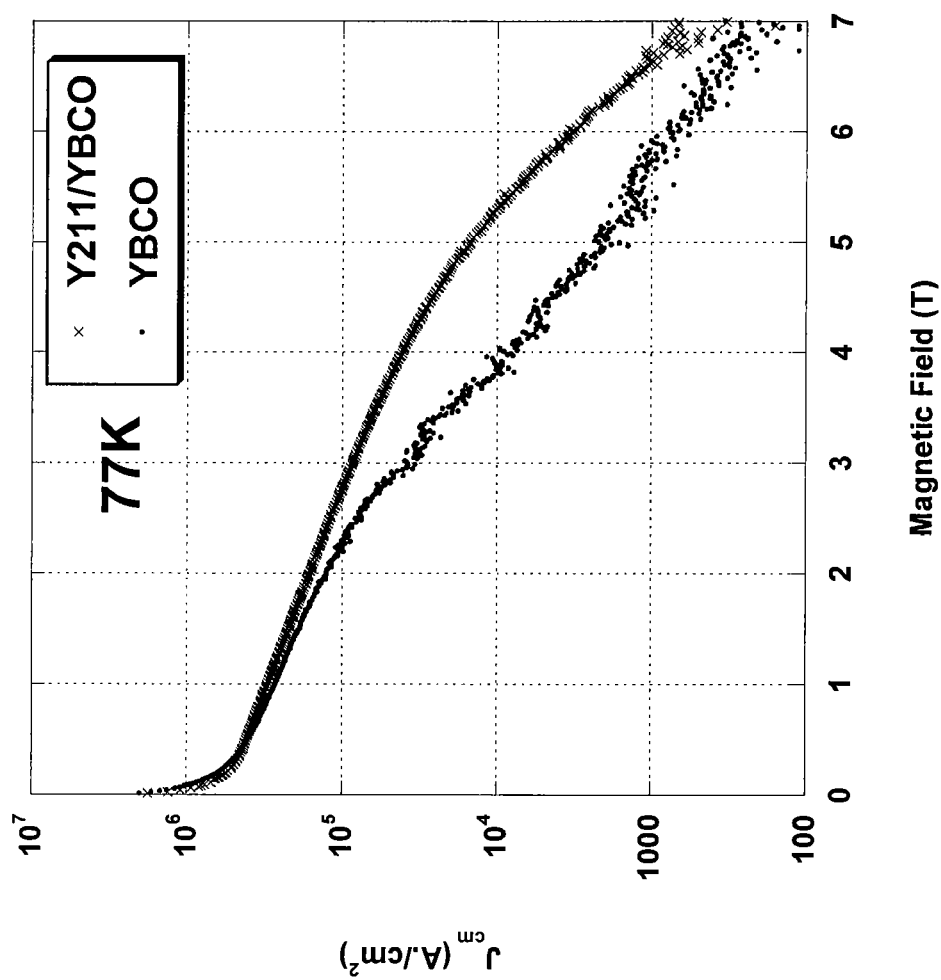
FIG. 4 is a plot of critical current density (Jc) versus total magnetic field (T) (including both applied and self field contributions) measured at 77K for a Y211/YBCO film according to the present invention compared to a conventional YBCO film sample.
Figure 5:
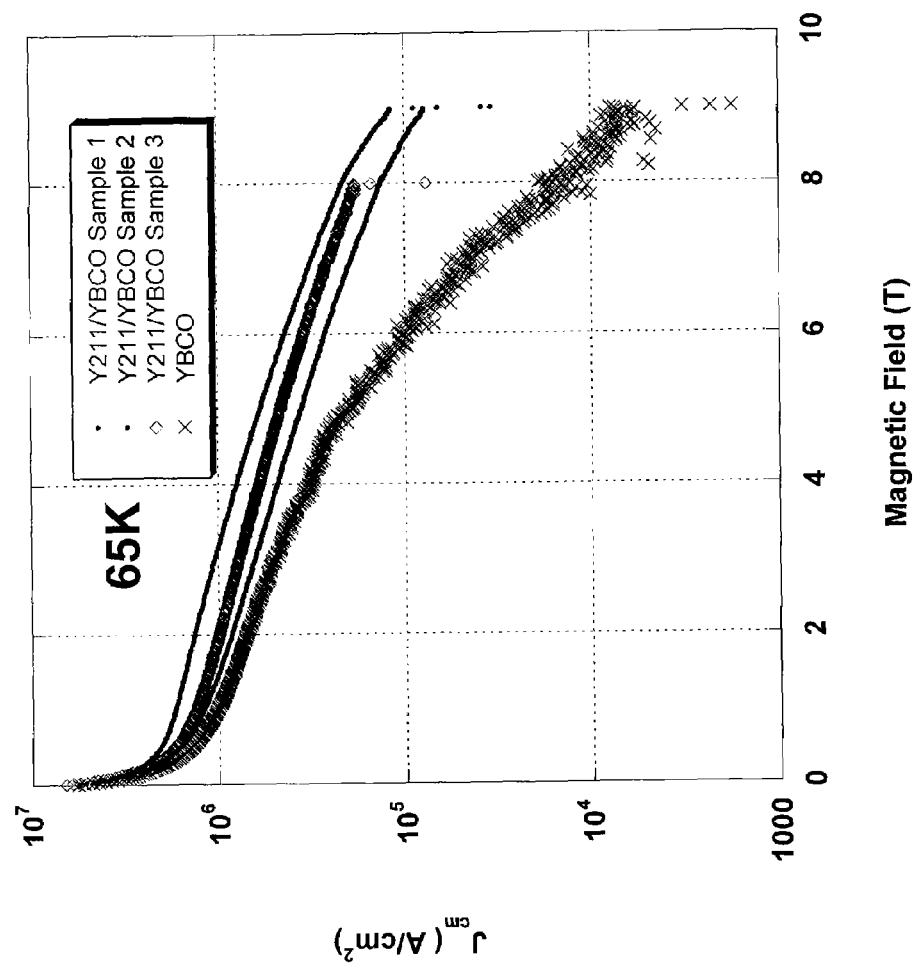
FIG. 5 is a plot of critical current density (Jc) versus total magnetic field (T) measured at 65 K for three different Y211/YBCO film samples according to the present invention compared to a conventional YBCO film sample.

FIGS. 4 and 5 show magnetization JC data of superconducting grains obtained at 77K and 65 K respectively for the Y211/YBCO films made according to the present invention on a $LaAlO_3$ substrate. For comparative purposes, data from a standard YBCO film, which was also formed on a $LaAlO_3$ substrate under similar growth conditions as the Y211/YBCO films, is also plotted in these figures. It can be seen that the $J_c$ is similar for both the standard YBCO and YBCO/Y211 samples at lower fields up 2T for 77K. However, as the applied magnetic field is increased, the $J_c$ of the standard YBCO film falls more rapidly while the YBCO/Y211 films maintain higher magnetization $J_c$ values longer before falling off rapidly, thus indicating more effective pinning at higher fields in the YBCO/Y211 films of the present invention.

Significant pinning at a larger range of applied magnetic fields is clearly seen in the 65K data presented in FIG. 5, which shows comparative data obtained from three different films of Y211/YBCO made according to the present invention and a standard YBCO film as a control. The pinning improvement can be clearly seen to occur in all the three film samples even up to 9T, with one sample having more than 10 times (an order of magnitude) improvement in magnetization $J_c$. In one embodiment, the transport critical current density in 0.5 μm thick films showed a $J_c$ of 3.1 $MA/cm^2$ in self-field at 77 K. Additional embodiments illustrative of the pinning enhancements provided by the present invention is further shown hereinafter with reference made to FIGS. 6-10.

According to another embodiment of the present invention, nanoparticles of other oxide material were used to introduce artificial magnetic flux pinning centers into superconductive films to increase the Jc at higher fields. It has been found that the pinning centers, in order to be effective in increasing the $J_c$ at higher fields, should be nanoparticles that are less than 15 vol % of the superconductor, and be randomly distributed to provide isotropic 3D pinning. Various second phase materials such as $BaSnO_3$, $Y_2BaCuO_5$, $BaZrO_3$, $BaIrO_3$, and $Nd_2O_3$ have been found to be effective in creating nanoparticles (in the desired volume percentage) in pulsed laser ablated (PLA) YBCO films made according to the present invention that provide effective pinning at various magnetic field levels.

In another illustrative embodiment, nanoparticles of $BaSnO_3$ were incorporated into $YBa_2Cu_3O_{7-x}$ (YBCO) films on (100) lanthanum aluminate single crystal substrates ($LaAlO_3$) substrates. The above described PLAD method used to create nanometer sized $Y_2BaCuO_5$ (Y211) particles in YBCO films successfully, was also used in producing the illustrated embodiment of FIGS. 8a-c. Using the dual sector pulsed laser deposition target according to the present invention to produce the films of this embodiment eliminates the reactions between $BaSnO_3$ and YBCO during the target preparation stage, but which allows the BaSnO3 to react locally and create defects that act as pinning centers. Due to a higher lattice mismatch and probable slight reactivity with the YBCO matrix (possible Sn diffusion into YBCO etc), the defects surrounding the nanoparticles created by the $BaSnO_3$ particles provide an enhanced flux pinning effectiveness at high fields.

Figure 8A:
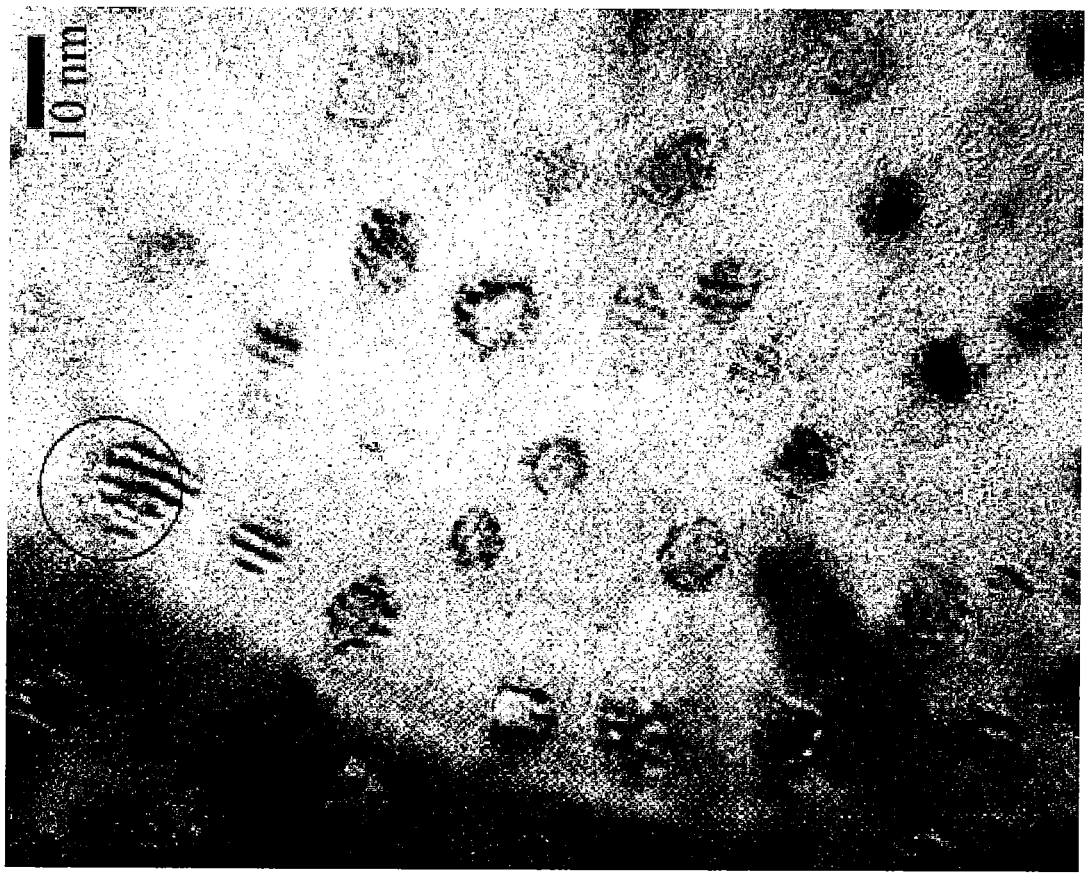

To produce the film embodiment shown by FIGS. 8a-c, a YBCO pulsed laser ablation target with a $BaSnO_3$ second phase pie wedge/sector was used to deposit the YBCO+ $BaSnO_3$ film coatings on the $LaAlO_3$ substrates. Similar to the method discussed above, the target consisting of $BaSnO_3$ and YBCO sector portions (e.g., portions 38 and 40 of FIG. 1), is made to rotate during the deposition. This allows the ablation of $BaSnO_3$ periodically, thereby allowing the introduction of send phase nanoparticles in a growing YBCO film. The sector angle θ of the $BaSnO_3$ used in this embodiment is 30°, but in other embodiments may be from 5 to 30° or more depending upon the desired composition. The excimer laser (wavelength λ=248 nm) was used to deposit films in the PLAD chamber 10. The deposition was carried out using 2 J $cm^{-2}$ laser energy at a 4 Hz repetition rate with a substrate temperature maintained at 780° C. The target to substrate distance was about 6 cm. The target was rotated at a speed of 15-20 rpm to obtain the composite YBCO+$BaSnO_3$ nanoparticle film. Per this system setup, the $BaSnO_3$ sector portion of the target is ablated once in approximately every 12 laser pulses.

The critical transition temperature ($T_c$) of the films was measured by an AC susceptibility method. The film microstructure was studied by using a high resolution scanning electron microscope (SEM) and a high resolution transmission electron microscope (TEM) operated at 200 kV and equipped with an energy dispersive x-ray spectrometer (EDS). Cross-sectional and plan view specimens were prepared using a hybrid method combining focused ion beam lift-out and conventional Ar+ ion milling for final thinning. The magnetization $J_c$ was measured by using a vibrating sample magnetometer (VSM) at 77 and 65 K. The thickness of the films was measured by using a profilometer and verified with a cross-sectional SEM and used for $J_c$ calculations. Transport current measurements were taken on an about 0.3 μm thick, 3 mm long, 1 mm wide bridge sample and in-field measurements performed to 12 T. The angular dependence of $J_c$ at 1 T was also measured.

The $T_c$ of the YBCO+BaSnO$_3$ films was found to be slightly reduced (between 86 and 89 K) as compared to standard YBCO films which are routinely made with $T_c$s higher than 90 K on LaAlO$_3$ substrates. The lowering of $T_c$ in the presence of the nanoparticles is consistent with other studies done with BaZrO$_3$ nanoparticles in PLAD YBCO films. The reason for the depressed $T_c$ may be possible Sn diffusion into the YBCO which might result in Sn substitutions in the copper sites that can locally depress $T_c$. The films in this embodiment had a $T_c$ of 88.5 K.

Figure 6:
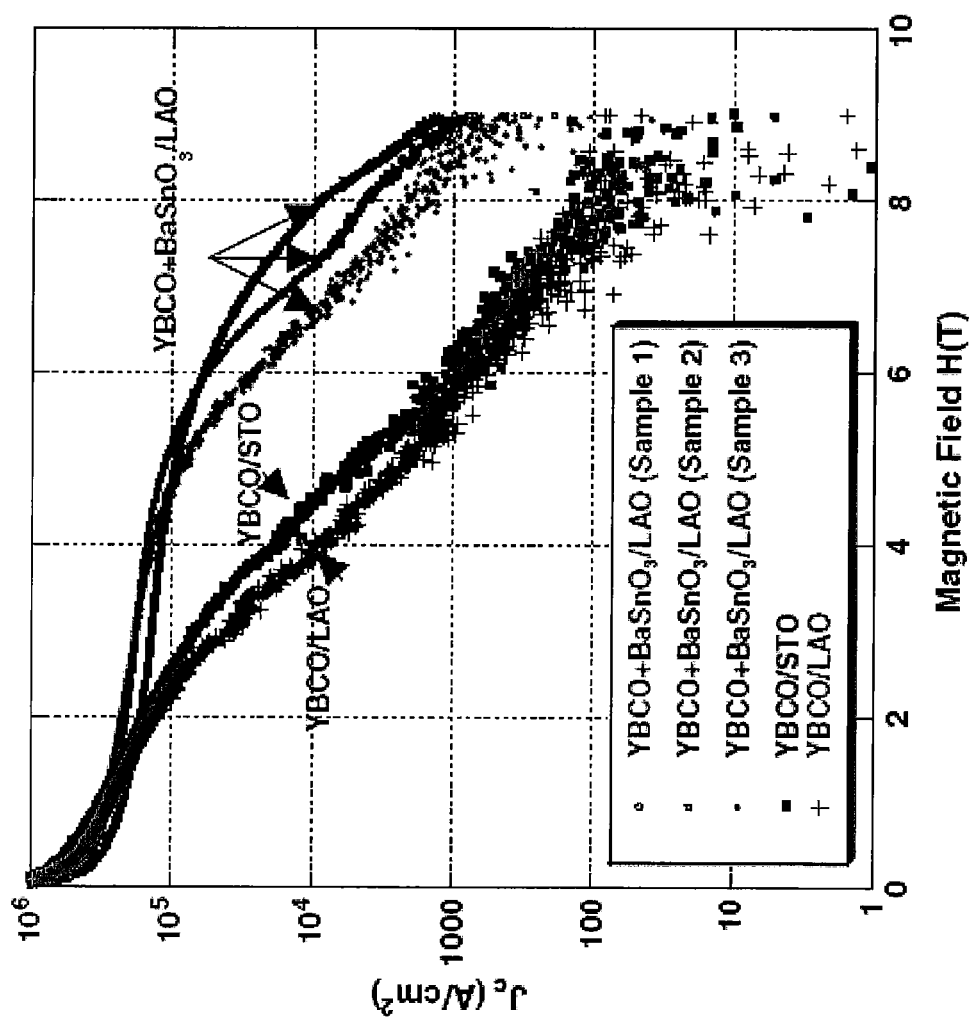
FIG. 6 is a plot of critical current density (Jc) versus applied magnetic field (H(T)) at 77 K for YBCO+BaSnO$_3$ film samples according to the present invention on LaAlO$_3$ substrates compared with conventional YBCO film samples on LaAlO$_3$ and SrTiO$_3$ substrates.
Figure 7:
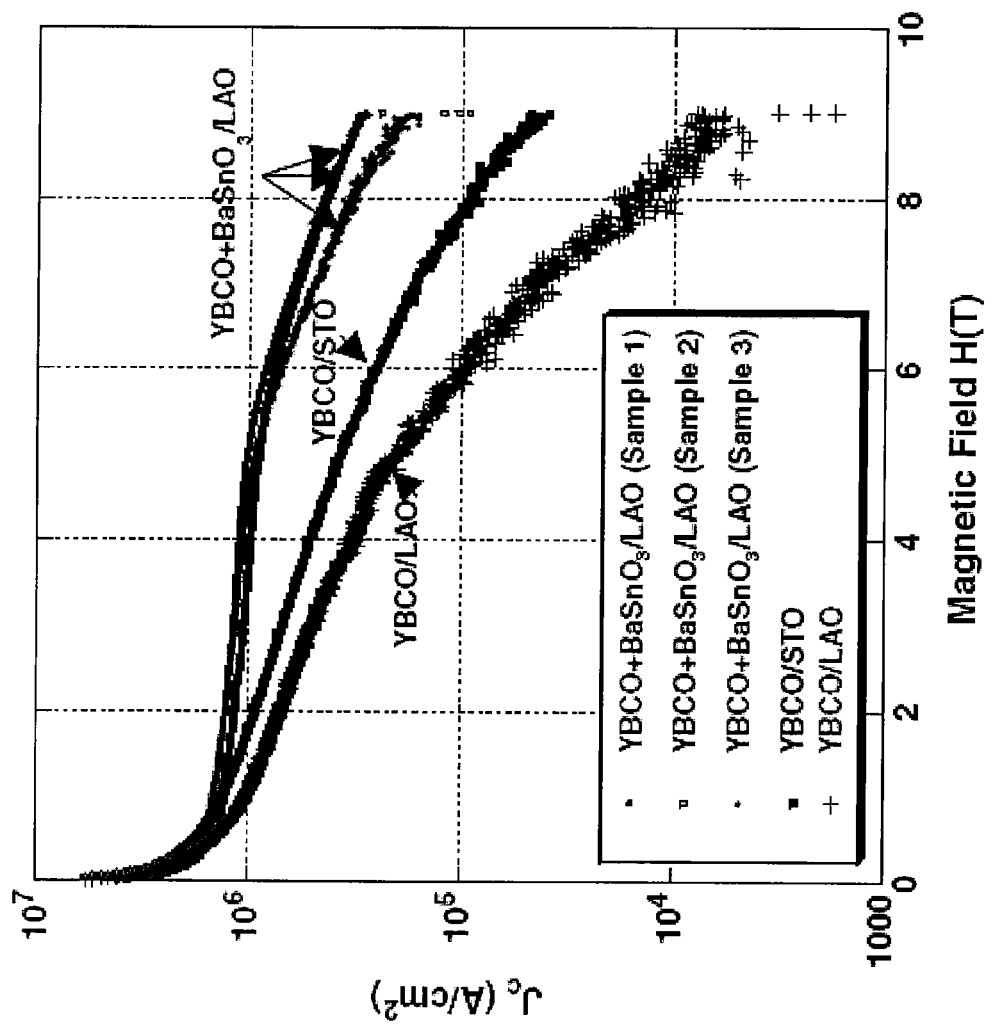
FIG. 7 is a plot of critical current density (Jc) versus applied magnetic field (H(T)) at 65 K for YBCO+BaSnO$_3$ film samples according to the present invention, each on a LaAlO$_3$ substrate, compared with conventional YBCO film samples on LaAlO$_3$ and SrTiO$_3$ substrates.

FIGS. 6 and 7 show the magnetization $J_c$ data at 77 and 65 K, respectively, which were collected using the VSM. Three different YBCO+BaSnO$_3$ samples of different thickness (240, 317, and 359 nm) were compared with two standard about 300 nm thick YBCO films on a (100) SrTiO3 single crystal substrate and a (100) single crystal LaAlO$_3$ substrate as control samples. A significant increase in the magnetization $J_c$ in YBCO+BaSnO$_3$ films was observed at both 77 and 65 K, especially at magnetic fields >2 T, compared to the control samples.

Compared to standard YBCO films, more than an order of magnitude increase in $J_c$ at 6 T at 77 K was achieved by the films according to the present invention. The increase in $J_c$ at high fields observed with BaSnO$_3$ particles was found to be higher than that observed with YBCO+Y$_2$BaCuO$_5$ samples made by the same method indicating that the defects created by the BaSnO$_3$ contribute more effectively to the flux pinning enhancement at high fields. The decrease in $J_c$ at low fields is due to the poor crystal quality (strained YBCO crystal planes) caused by the nanoparticles or simply that optimization of the pinning density is possible. Also the incorporation of non-superconducting BaSnO$_3$ phase (estimated to be 10-15 vol %) should lower the $J_c$ by about 10-15% as a first approximation (due to dilution of superconducting phase) at low field.

The $H_{irr}$ was significantly increased for the YBCO+BaSnO$_3$ films at both 65 and 77 K as compared to undoped YBCO. The value of $H_{irr}$ for the YBCO+BaSnO$_3$ films according to the present invention was found to be 8.51 T at 77 K as compared to the 6-7 T commonly cited for undoped YBCO. In particular, the $H_{irr}$ for the YBCO+BaSnO$_3$ films was found to be 13.4 T at 65 K. In an embodiment using SmBCO nanoparticles, a high value of 8.5 T at 77 K for such a doped YBCO was determined by extrapolating the linear section in the volume flux pinning force ($F_p$) versus H plots. For some of the samples, evidence of twin peaks in the flux pinning force ($F_p$) plots was also observed and these are believed to be due to low $T_c$ regions in a high $T_c$ matrix of YBCO.

SEM observations of the surface show the presence of particles typical of PLAD films as well as a high density of uniformly distributed nanoparticles about 10 nm in size. The number density of these particles was found to be about $3 \times 10^{15}$ m$^{-2}$. FIG. 8a is a TEM image of a YBCO+BaSnO$_3$ sample according to the present invention where the nanoparticles are the striped features about 10 nm in size spaced apart by about 10 nm. The distinct moiré fringe (stripe) contrast shown in FIGS. 8a and 8c arises from the superposition of two disparate lattices, which in this case, are the nanoparticles and the YBCO matrix. FIG. 8b shows in plan view, the high density of the nanoparticles.

Figure 9:
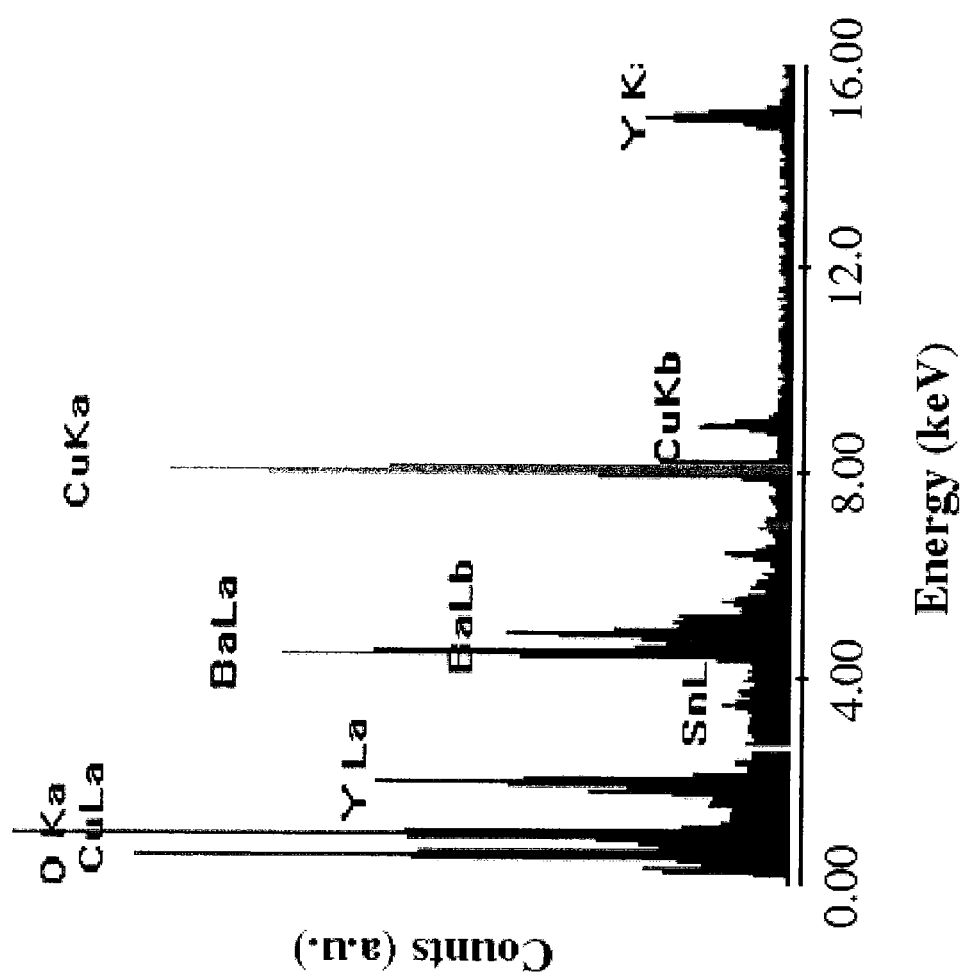
FIG. 9 is a plot of X-ray energy dispersive spectra taken from one of the particles (e.g., the circled particle in FIG. 8a) showing the presence of Sn in the particles.

All the secondary phase precipitates were found to be Sn rich by EDS analysis, shown in FIG. 9. Cross-sectional high resolution TEM images, such as FIG. 8c, suggest the presence of disc-shaped defects surrounded by significant strain contrast. The strain in the lattice could be from either groups of Sn rich atoms, ultrafine BaSnO$_3$ particles or some other defects. In addition to the diffraction reflections from YBCO, additional diffraction spots were observed which may correspond to barium tin oxides but could not be uniquely attributed to the stoichiometric BaSnO$_3$ phase. The presence of these particles and the strain fields surrounding these particles due to the lattice mismatch (about 7.7%) between BaSnO$_3$ and YBCO are thought to contribute to the improvements observed in $J_c$.

In the low field regime, where $J_c \propto H^{-\alpha}$, the value of a for typical YBCO control samples was around 0.5. This value indicates the presence of a dilute distribution of defects. However, with YBCO+BaSnO$_3$ films, an α of 0.2-0.3 at 77 K was measured, which is consistent with the value of α observed in other strongly pinning systems with Y$_2$O$_3$, BaZrO$_3$ particles.

Figure 10:
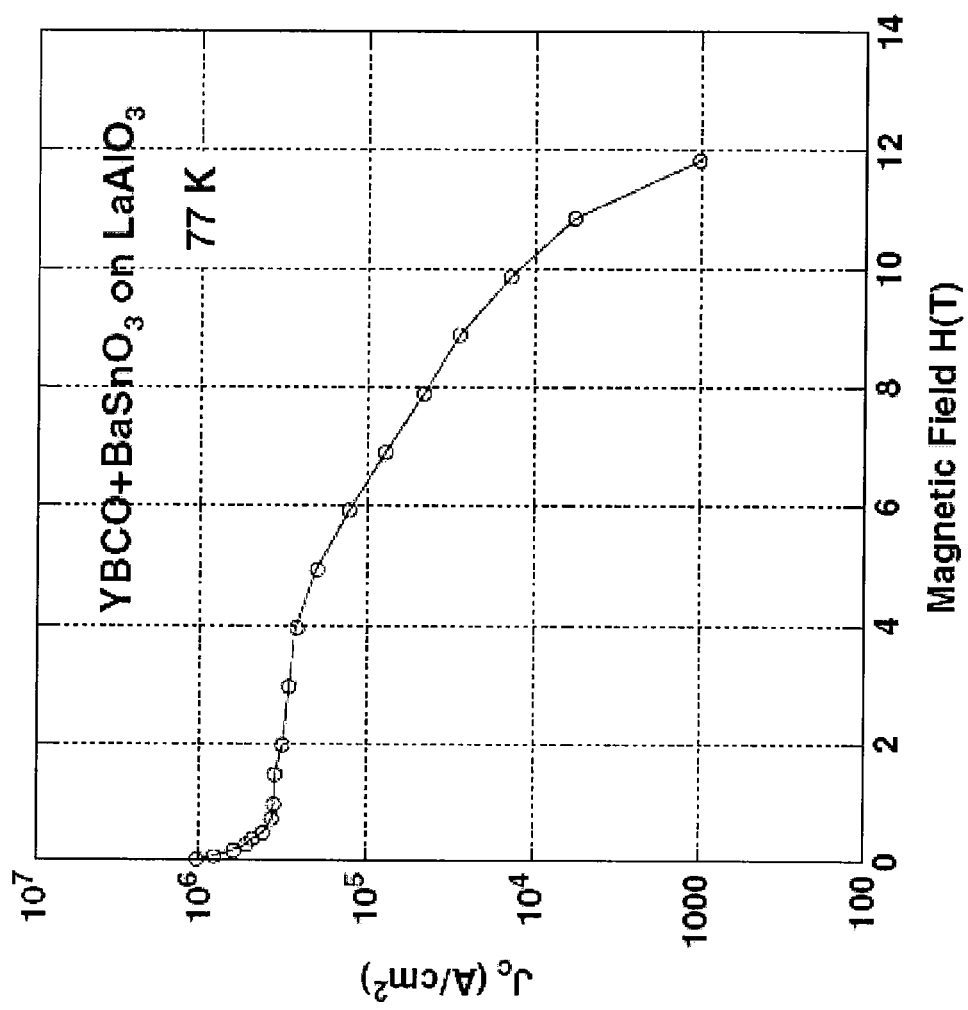
FIG. 10 is a plot of transport critical current density ($J_c$) measurements on a YBCO+BaSnO$_3$ film sample according to the present invention in an applied magnetic field (H||c).

The transport current measurements in the applied magnetic field are shown in FIG. 10. It can be seen that $J_c$ does not decrease rapidly with applied field as observed in the magnetization $J_c$ measurements. While the self-field $J_c$ was a little low ($10^6$ A cm$^{-2}$) a high $J_c$ of $1.1 \times 10^5$ A cm$^{-2}$ at 6 T, and a $J_c$ of $1.1 \times 10^4$ A cm$^{-2}$ at 10 T were observed. The angular dependence of $J_c$ measurements indicated that $J_c$ parallel to C ($3.7 \times 10^5$ A cm$^{-2}$) is higher than Jc parallel to ab planes ($2.8 \times 10^5$ A cm$^{-2}$) by 1.3 times at 1 T and 77 K, implying that c-axis correlated defects may be present in the sample. The lattice mismatch between BaSnO$_3$ and YBCO is large enough to generate dislocations in thin film samples; however the particulate size in these samples is small enough that the strain may be accommodated elastically rather than plastically. Such an arrangement may still lead to a vertical stacking effect, where nanoparticles in the upper regions of the film nucleate above existing nanoparticles where there is a minimum in the local strain field.

It is to be appreciated that more than an order of magnitude improvement in the high field magnetization $J_c$ at 6 T at 77 K was observed in the composite YBCO+BaSnO$_3$ films as compared to standard YBCO films. In addition, the irreversibility field ($H_{irr}$) increased to 8.5 T at 77 K and to 13.4 T at 65 K. The in-field transport current measurements confirmed an order of magnitude improvement in high fields. The angular dependence of the $J_c$ data at 1 T showed that $J_c H \| c$ is 1.3 times higher than $J_c H \| ab$ indicating the presence of c-axis correlated defects.

It is believed that the c-axis correlated defects created by the BaSnO$_3$ particles could help reduce the anisotropy of the critical current density. The technique of using a dual phase sectored PLAD target gives the flexibility of introducing second phase particulates in an uninterrupted, more random fashion. By selecting a proper laser scanning sequence, the desired amount of BaSnO$_3$ nanoparticles can be introduced into the growing YBCO film. Since the BaSnO$_3$ and YBCO are ablated with the same laser power and frequency, the particle growth of BaSnO$_3$ is restricted to nanoparticle size in the YBCO film. Also since a separate sector is used instead of pre-mixed targets, any possible reactions between BaSnO$_3$ and YBCO during the target preparation stage were eliminated, but the BaSnO3 is allowed to react locally (Sn may diffuse into YBCO to substitute for Cu) and create defects during growth in a scalable and continuous manner.

As illustrated in the above embodiments, second phase nanoparticles were incorporated during the growth of superconductive films through ablation of a target having second phase material portion and YBCO portion in a pulsed laser ablation chamber. The resulting YBCO composite films have been shown to have $J_c$s more than an order of magnitude higher at high magnetic fields compared to standard YBCO. The presence of high number density 10 nm size nanoparticles and associated strain fields around them are believed to be responsible for the observed enhancements.

As illustrated above, the incorporation of nanoparticles according to the present invention increases substantially the current carrying ability of YBCO based materials. Accordingly, it is believed that in other embodiments, films of superconductive materials such as, for example, $Bi_2Sr_2CaCu_2O_x$, $(Bi,Pb)_2 Sr_2Ca_2Cu_3O_x$, $La_{1.85}Ba_{0.15}CuO_4$, other cuprates, and Type-II superconductive substances will similarly benefit by being incorporated with nanoparticles of a non-superconductive material(s) selected from metals, ceramics, alloys, oxides, nitride materials, silver, gold, MgO, $SrTiO_3$, $BaSnO_3$, $Y_2BaCuO_5$, $BaZrO_3$, $BaIrO_3$, $Y_2O_3$, SmBCO, $Nd_2O_3$, and combinations thereof, according to the present invention for flux pinning enhancements. Higher current carrying ability conductors result in cost saving in terms of material requirements. Similar advantages can be realized in other material/composite systems using the present invention. As such, it is believe that the present invention will benefit manufacturing industries and R&D companies that are involved in producing and developing nano-composites coatings (either metal or ceramic based) for improved performance in applications of multilayer coatings, specialty coatings, special alloys manufacturing, etc.

Additionally, coating techniques in addition to pulse laser ablation deposition (PLAD), such as for example, pulsed electron beam deposition (PED), sputtering, etc., can also benefit from using the target and method of the present invention. For example, $YBa_2Cu_3O_{7-x}$ (YBCO) coated conductors are processed by depositing YBCO coatings on buffered highly textured metallic substrates. These metallic substrates can be either textured in order to transfer the texture to the buffer layers or polished polycrystalline substrates on which buffer layers were grown with texture using ion beam assisted deposition (IBAD). The present invention provides the ability to process composites coatings in a continuous fashion, the ability to separate the constituents and widen the choices for the selection of materials, and the ability to vary the composition along the thickness of the coatings provided. In addition, scalability does not seem to be a problem using the present invention since the targets using multi-phases can be used in the place of a single target and long length coated conductors (for example, about 200 meters) can be made. Accordingly, as disclosed by the above illustrated embodiments, significant improvements are achievable in the processing of textured YBCO coated conductors in long lengths by using the present invention to improve the critical current density ($J_c$) of the YBCO needed as a means to make a higher in-field engineering current density ($J_E$) conductor necessary for applications in devices which have high current carrying conductors.

The above description and drawings are only to be considered illustrative of exemplary embodiments, which achieve the features and advantages of the present invention. Modification and substitutions to the present invention can be made without departing from the spirit and scope of the present invention. Accordingly, the invention is not to be considered as being limited by the foregoing description and drawings.

What is claimed is:

1. A method of forming a superconductive film, the method comprising:
    providing a target having a first portion of a superconductive material and a second portion of a non-superconductive material, wherein the providing the target further comprises
        providing a first pressed disc comprising the superconductive material and defining a disc thickness;
        providing a second pressed disc comprising the non-superconductive material;
        removing a wedge-shaped cutout section from the first pressed disc to leave a wedge-shaped groove in the first pressed disc, the first pressed disc with the wedge-shaped cutout section so removed defining said first portion of said target;
        removing a sector-shaped portion from the second pressed disc, the sector-shaped portion configured to fit within the wedge-shaped groove in the first pressed disc; and
        bonding the sector-shaped portion within the wedge-shaped groove of the first pressed disc, the sector-shaped portion so bonded within the insert region defining said second portion of said target;
    providing a substrate a distance from said target;
    rotating said target at a desired speed to obtain a predetermined pulse ratio of said superconductive material to said non-superconductive material; and
    striking said rotating target with a laser to provide said substrate with a film of said superconductive material, said film having a random inclusion of nanometer-sized particulates of said non-superconducting material for flux pinning enhancement.

2. The method according to claim 1 wherein said superconductive material comprises $YBa_2Cu_3O_{7-x}$.

3. The method according to claim 2, wherein said non-superconductive material comprises $Y_2BaCuO_5$.

4. A method of forming a superconductive film, the method comprising:
    providing a target having a first portion of a superconductive material and a second portion of a non-superconductive material, wherein the providing the target further comprises
        providing a pressed disc comprising the superconductive material;
        providing a wedge-shaped thin sector comprising the non-superconductive material; and
        attaching the wedge-shaped thin sector onto a top surface of the pressed disc, such that the pressed disc defines said first portion of said target and the wedge-shaped thin sector defines said second portion of said target;
    providing a substrate a distance from said target;
    rotating said target at a desired speed to obtain a predetermined pulse ratio of said superconductive material to said non-superconductive material; and
    striking said rotating target with a laser to provide said substrate with a film of said superconductive material, said film having a random inclusion of nanometer-sized particulates of said non-superconducting material for flux pinning enhancement.

5. The method according to claim 4, wherein said superconductive material comprises $YBa_2Cu_3O_{7-x}$.

6. The method according to claim 5 wherein said non-superconductive material comprises $Y_2BaCuO_5$.

* * * * *